(12) United States Patent  (10) Patent No.: US 8,022,453 B2
Park  (45) Date of Patent: Sep. 20, 2011

(54) IMAGE SENSOR AND MANUFACTURING METHOD FOR SAME

(75) Inventor: Sang Hyuk Park, Chungcheongbuk-do (KR)

(73) Assignee: Crosstek Capital, LLC, Wilmington, DE (US)

( * ) Notice: Subject to any disclaimer, the term of this patent is extended or adjusted under 35 U.S.C. 154(b) by 0 days.

(21) Appl. No.: 12/850,210

(22) Filed: Aug. 4, 2010

(65) Prior Publication Data

US 2011/0042765 A1  Feb. 24, 2011

Related U.S. Application Data

(62) Division of application No. 11/647,430, filed on Dec. 29, 2006, now Pat. No. 7,785,917.

(30) Foreign Application Priority Data

Dec. 29, 2005 (KR) .................... 10-2005-0134264

(51) Int. Cl.
 *H01L 31/062* (2006.01)
(52) U.S. Cl. ......... 257/294; 257/E31.124; 257/E31.127; 438/70; 438/68; 438/98
(58) Field of Classification Search .............. 257/294, 257/E31.124, E31.127; 438/70, 68, 98
See application file for complete search history.

(56) References Cited

U.S. PATENT DOCUMENTS

| | | | |
|---|---|---|---|
| 4,396,156 A | 8/1983 | Southworth et al. | |
| 7,129,532 B2 | 10/2006 | Lee | |
| 7,435,615 B2 | 10/2008 | Kim | |
| 2002/0027228 A1 | 3/2002 | Lee | |
| 2002/0081864 A1 | 6/2002 | Zheng et al. | |
| 2003/0224613 A1 | 12/2003 | Ramanathan et al. | |
| 2004/0012734 A1 | 1/2004 | Yamanaka et al. | |
| 2004/0065554 A1 | 4/2004 | Cohen | |
| 2004/0171181 A1 | 9/2004 | Lee et al. | |
| 2004/0180465 A1 | 9/2004 | Musolf et al. | |
| 2005/0000431 A1 | 1/2005 | Elers | |
| 2005/0208692 A1 | 9/2005 | Lee | |
| 2005/0245066 A1 * | 11/2005 | Mis ............................. | 438/618 |
| 2006/0019424 A1 | 1/2006 | Weng et al. | |
| 2006/0038182 A1 | 2/2006 | Rogers et al. | |
| 2007/0048996 A1 | 3/2007 | Lange et al. | |

FOREIGN PATENT DOCUMENTS

| | | | |
|---|---|---|---|
| JP | 05275963 A | * | 10/1993 |
| KR | 1020050011951 | | 1/2005 |
| KR | 20050094237 | | 9/2005 |

* cited by examiner

*Primary Examiner* — Tu-Tu V Ho
(74) *Attorney, Agent, or Firm* — McAndrews, Held & Malloy, Ltd.

(57) ABSTRACT

An image sensor including a first region where a pad is to be formed, and a second region where a light-receiving element is to be formed. A pad is formed over a substrate of the first region. A passivation layer is formed over the substrate of the first and second regions to expose a portion of the pad. A color filter is formed over the passivation layer of the second region. A microlens is formed over the color filter. A bump is formed over the pad. A protective layer is formed between the bump and the pad to expose the portion of the pad.

20 Claims, 17 Drawing Sheets

IMAGE SENSOR AND MANUFACTURING METHOD FOR SAME

CROSS-REFERENCE TO RELATED APPLICATIONS/INCORPORATION BY REFERENCE

The present application is a divisional of U.S. application Ser. No. 11/647,430, filed Dec. 29, 2006 which claims priority to KR Application 10-2005-0134264, filed Dec. 29, 2005. The Application expressly hereby incorporates by reference each of the above-identified applications herein in their entirety.

BACKGROUND OF THE INVENTION

The present invention relates to a semiconductor fabrication technology, and more particularly, to an image sensor having a pad for electrically connecting a light-receiving element to an external line, and a manufacturing method for the same.

In recent years, a demand for a digital camera is explosively increasing with the development of visual communication technology using Internet. In addition, with an increasing spread of a mobile communication terminal such as a personal digital assistant (PDA), an international mobile telecommunications-2000 (IMT-2000), a code division multiple access (CDMA) terminal or the like, in which a camera is mounted, a demand for a miniaturized camera module is also increasing accordingly.

The camera module includes an image sensor. In general, a charge coupled device (CCD) and a complementary metal oxide semiconductor (CMOS) image sensor are widely used as the image sensor module. In the image sensor, to realize a color image, a color filter is aligned over a photo-detector that receives light from an exterior to generate photo-charges and accumulates the generated photo-charges. The color filter array (CFA) is configured with three color filters, e.g., red R, green G and blue B, or yellow, magenta and cyan. Typically, the three color filters with the red R, green G and blue B are mostly used as the color filter array in the CMOS image sensor.

Such an image sensor is a semiconductor device that converts an optical image into an electrical signal. As described above, the CCD and CMOS image sensor have been developed and are widely commercialized until now. The CCD has a structure in which each MOS capacitor is closely located and charges are stored in the MOS capacitor and transferred to a target. On the other hand, the CMOS image sensor employs CMOS technology that uses a control circuit and a signal processing circuit as peripheral circuits and adopts a switching mode that detects outputs sequentially. Here, MOS transistors are formed in the peripheral circuit as many as the pixels in the CMOS image sensor.

The CCD image sensor, however, has several disadvantages. Power consumption is too high. A manufacturing process is too complicated because of a plurality of masking processes. The CCD image sensor is hardly manufactured in one chip because it is difficult to embody a signal processing circuit within one chip. Thus, many researchers have attempted to develop such a CMOS image sensor using a sub-micron CMOS fabrication technology to overcome the above-listed disadvantages.

In the CMOS image sensor, a photodiode and MOS transistors are formed in a unit pixel, and thus signals are detected in sequence by a switching mode. As a result, an image can be implemented. Since the CMOS image sensor employs the CMOS fabrication technology, it has several advantages as compared with the CCD. Specifically, the power consumption of the CMOS image is lower than that of the CCD. In addition, the CMOS image sensor has a simplified fabrication process because it requires only about 20 masking processes whereas the CCD requires 30 to 40 masking processes. Further, various signal processing circuits and others can be integrated within one chip. For these reasons, the CMOS image sensor is being highlighted as a next generation image sensor.

Generally, the CMOS image sensor includes a photo-detector for detecting light and a logic circuit component for processing the detected light into an electrical signal, which is, in turn, systemized into data. There have been numerous attempts to improve a fill factor, which represents an area ratio of the light-sensing element with respect to the overall image sensor. However, these attempts are limited since the logic circuit component cannot be basically removed. Therefore, there is introduced a light condensing technology for changing paths of incident lights that enter other areas except the light-sensing element and condensing the incident lights into the light-sensing element so as to enhance photosensitivity. To realize the light condensing technology, a method for forming a microlens on the color filter of the image sensor is particularly used.

FIGS. 1A to 1F are cross-sectional views illustrating a method for manufacturing a typical CMOS image sensor. Herein, the region A denotes a region where a pad will be formed (hereinafter, referred to as the pad region A), and the region B denotes a region where a light-receiving region where a light-receiving element of a unit pixel will be formed (hereinafter, referred to as the light-receiving region B).

Referring to FIG. 1A, an aluminum (Al) metal interconnection 101 is formed over an underlying structure having various elements such as a photodiode and transistors constituting an image sensor. A nitride layer 102, which acts as an etch stop layer during an etching process for forming a pad contact, is formed over the Al metal interconnection 101.

An oxide layer 103 and a nitride layer 104, which act as a protective layer for protecting the Al metal interconnection 101, are formed along a surface profile of the resultant structure including the Al metal interconnection 101. A photoresist pattern 105 is formed over the nitride layer 104 for forming a pad contact, wherein the photoresist pattern 105 exposes a portion of the nitride layer 104 corresponding to the Al metal interconnection 101 of the pad region A.

Referring to FIG. 1B, the nitride layer 104 is etched through an etching process using the photoresist pattern 105 as an etch mask to define a region 106 where a pad will be formed. At this time, the oxide layer 103 is also etched partially. Here, reference symbols 104A and 103A denote a remaining nitride layer and a remaining oxide layer, respectively, after the etching process. Afterwards, the photoresist pattern 105 is removed.

Referring to FIG. 1C, a lower over coating layer (OCL) 107, color filters 108, an upper OCL 109, and microlenses 110 are sequentially formed over the light-receiving region B. Referring to FIG. 1D, a low temperature oxide (LTO) layer 111 is formed along a surface profile of the resultant structure including the microlenses 110.

Referring to FIG. 1E, a photoresist pattern 112 is formed over the LTO layer 111 for forming a pad contact, wherein the photoresist pattern 112 exposes a portion of the LTO layer 111 corresponding to the Al metal interconnection 101 of the pad region A.

Referring to FIG. 1F, the exposed portion of the LTO layer 111, the remaining oxide layer 103A, and the nitride layer 102 are sequentially etched using the photoresist pattern 112 as an etch mask, thereby forming an opening 113 exposing the Al metal interconnection 101. Here, reference symbols 111A, 103B and 102A denote an LTO pattern, an oxide pattern, and a nitride pattern, respectively. Thereafter, the photoresist pattern 112 is removed.

As described above, in the typical method for manufacturing the image sensor, the LTO layer is formed for protecting the light-receiving element. The light-receiving element plays a role in condensing light incident from an exterior onto a photodiode, and is configured with color filters and microlenses. Thus, it is necessary to form a protective layer for protecting the light-receiving element physically or chemically. The reason is that there always exist external environmental factors such as moisture, particles and thermal stress in a fabrication process line, which may damage the color filters and microlenses, even after forming the color filters and the microlenses. However, according to the typical method for manufacturing the image sensor using the LTO layer as a final protective layer, a peeling phenomenon in which a portion of the LTO layer is peeled off during the fabrication process may occur.

FIGS. 2A and 2B illustrate cross-sectional views showing peeling and crack phenomena of the LTO layer.

After forming the opening (113 of FIG. 1F), an ashing process is performed to remove the photoresist pattern (112 of FIG. 1E). However, referring to FIG. 2A, during the ashing process, $O_2$ plasma gas often flows into the upper OCL 109 at a portion marked as a circular dotted line 130, which causes anisotropic etching on the upper OCL 109.

Thus, referring to FIG. 2B, a space is created between the remaining nitride layer 104A acting as the passivation layer and the LTO layer 111. This space leads to the peeling phenomenon in which a portion of the LTO layer 111 is peeled off during a subsequent fabrication process and package process. Moreover, when a crack exists in the LTO layer 111 due to the peeling phenomenon, the microlens is likely to be damaged due to $O_2$ plasma. This damage is illustrated as a circular solid line in FIG. 3, and this damage may result in a process failure.

SUMMARY OF THE INVENTION

Embodiments of the present invention are directed to provide an image sensor that can prevent peeling and crack phenomena of a low temperature oxide (LTO) layer, and also prevent damage to a microlens, and a method for manufacturing the same.

Embodiments of the present invention are directed to provide an image sensor that can reduce a distance of light reaching a photodiode from a microlens by forming the image sensor without an LTO layer, as compared with an image sensor with an LTO layer, and a method for manufacturing the same.

Embodiments of the present invention are directed to provide an image sensor that can minimize damage to a microlens and particle attachment thereon occurring during a wafer sawing process, and a method for manufacturing the same.

In accordance with an aspect of the present invention, there is provided an image sensor including a first region where a pad is to be formed, and a second region where a light-receiving element is to be formed, the image sensor including: a pad formed over a substrate of the first region; a passivation layer formed over the substrate of the first and second regions to expose a portion of the pad; a color filter formed over the passivation layer of the second region; a microlens formed over the color filter; a bump formed over the pad; and a protective layer formed between the bump and the pad to expose the portion of the pad.

In accordance with another aspect of the present invention, there is provided a method for manufacturing an image sensor having a first region where a pad is to be formed, and a second region where a light-receiving element is formed, the method including: preparing a wafer in which a metal interconnection is formed in the first region, and a microlens is formed in the second region; forming a protective layer over the wafer having the microlens; etching a portion of the protective layer to form a pad exposing the metal interconnection of the first region; forming a bump connected to the pad in the first region; and removing the protective layer formed over the second region.

DESCRIPTION OF SPECIFIC EMBODIMENTS

For the typical method for manufacturing an image sensor, an low temperature oxide (LTO) layer may be prone to peeling and crack phenomena because the LTO layer is used as a protective layer for a microlens. Moreover, the LTO layer may have another limitation in that light is not focused on the photodiode but focused on an interlayer dielectric layer because the distance of light reaching a photodiode from the microlens is relatively long. Thus, the LTO layer is more likely not to be used in a unit pixel with the size of 0.25 µm×0.25 µm or smaller.

FIGS. 4A to 4H are cross-sectional views illustrating a method for manufacturing an image sensor without using an LTO in accordance with an embodiment of the present invention. Here, the region A denotes a region where a pad will be formed (hereinafter, referred to as the pad region A), and the region B denotes a region where a light-receiving region where a light-receiving element of a unit pixel will be formed (hereinafter, referred to as the light-receiving region B).

Figure 1A:
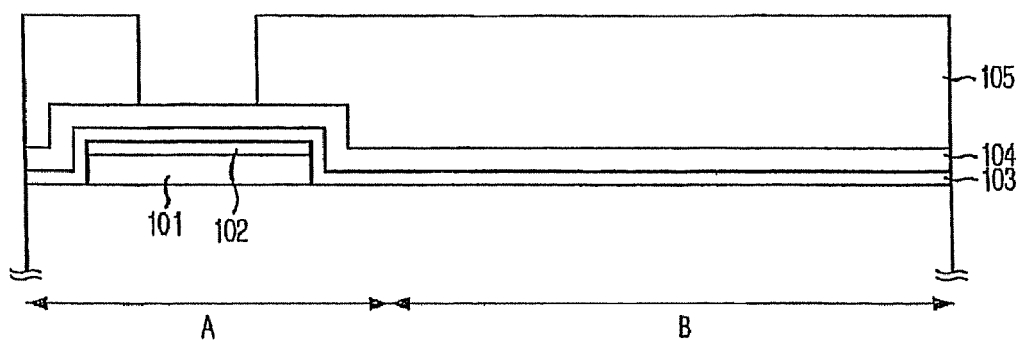
FIGS. 1A to 1F are cross-sectional views illustrating a method for manufacturing a typical CMOS image sensor.
Figure 1B:
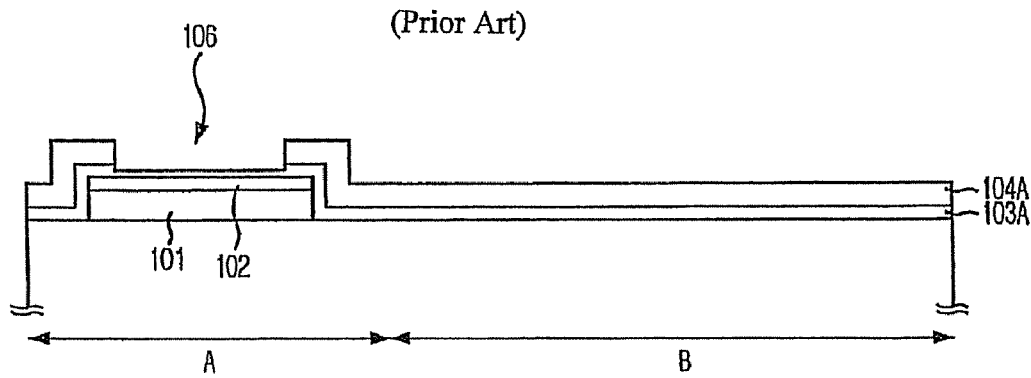
Figure 1C:
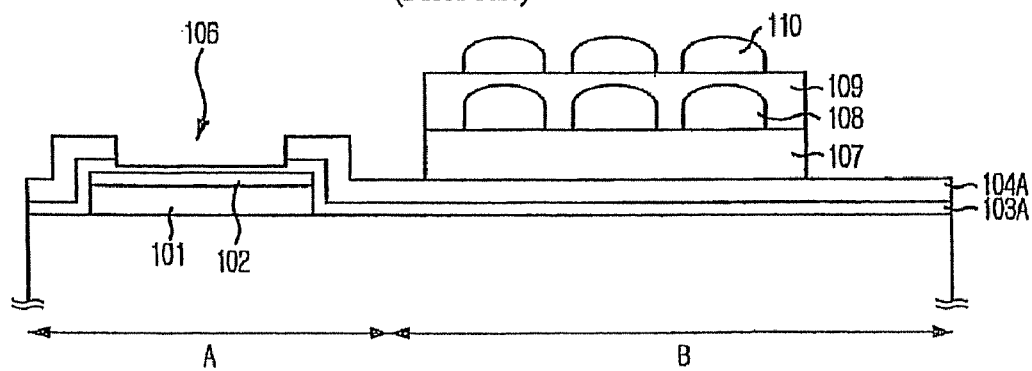
Figure 1D:
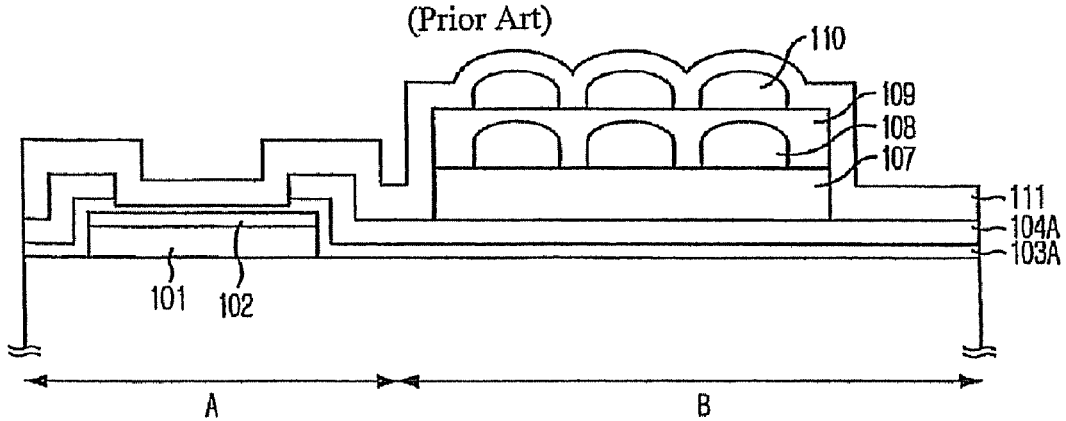
Figure 1E:
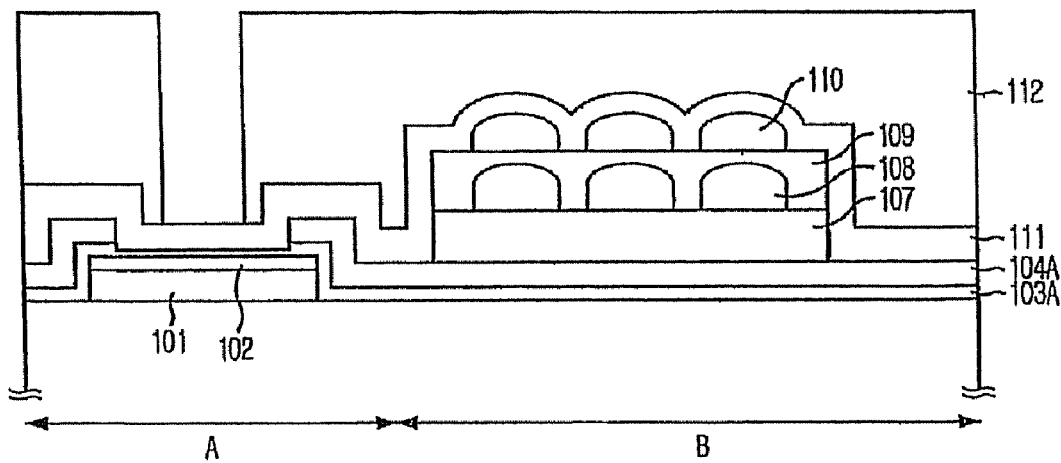
Figure 1F:
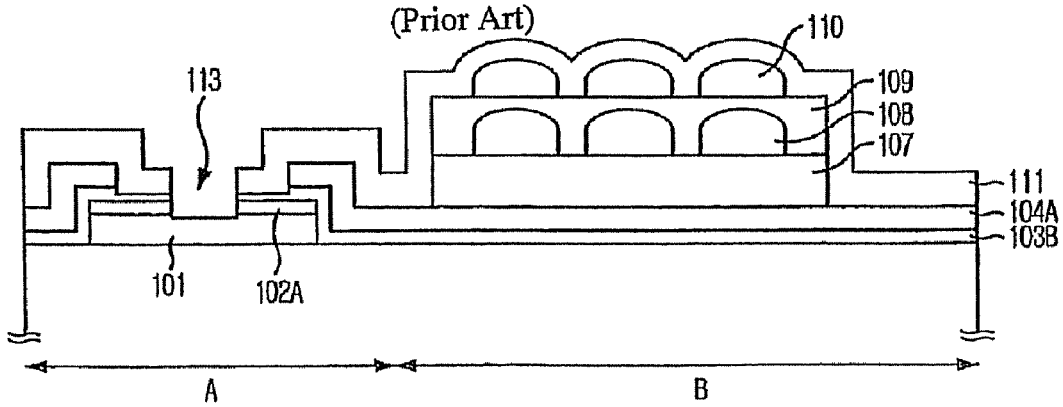
Figure 2A:
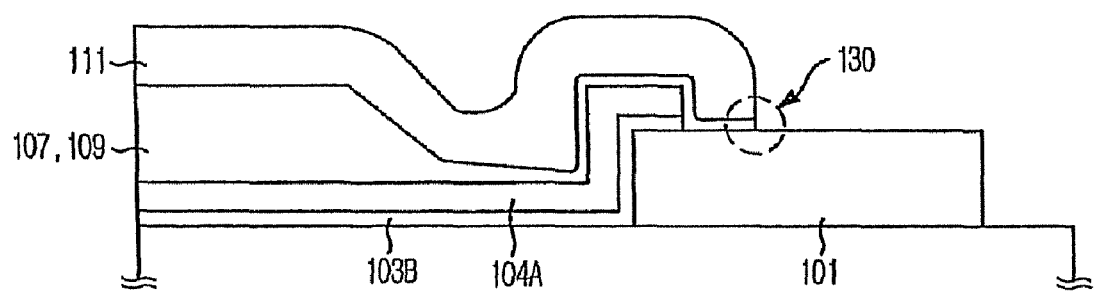
FIGS. 2A and 2B illustrate cross-sectional views showing peeling and crack phenomena of an LTO layer.
Figure 2B:
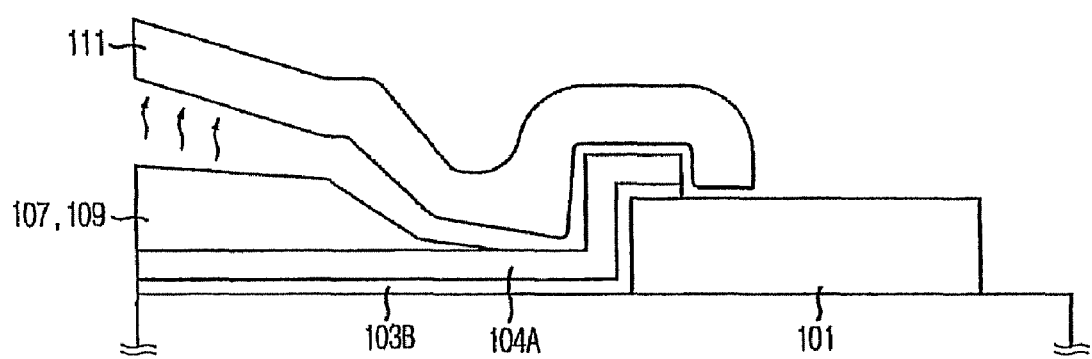
Figure 3:
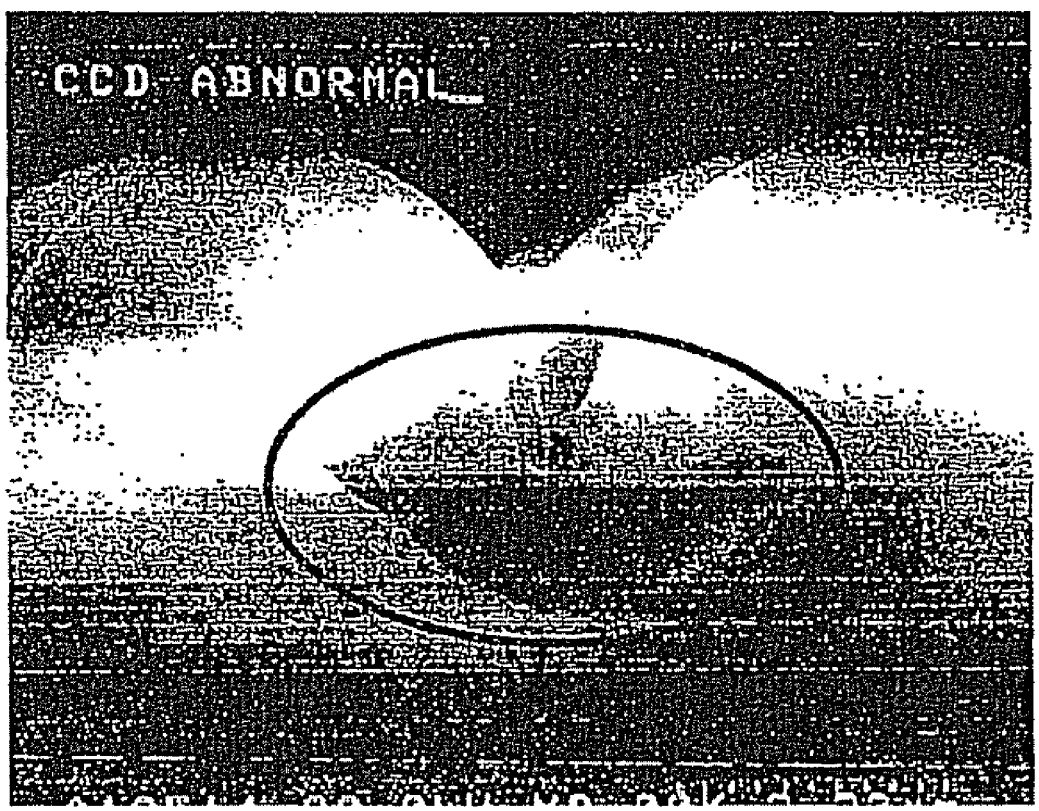
FIG. 3 illustrates a micrograph of a damaged microlens.
Figure 4A:
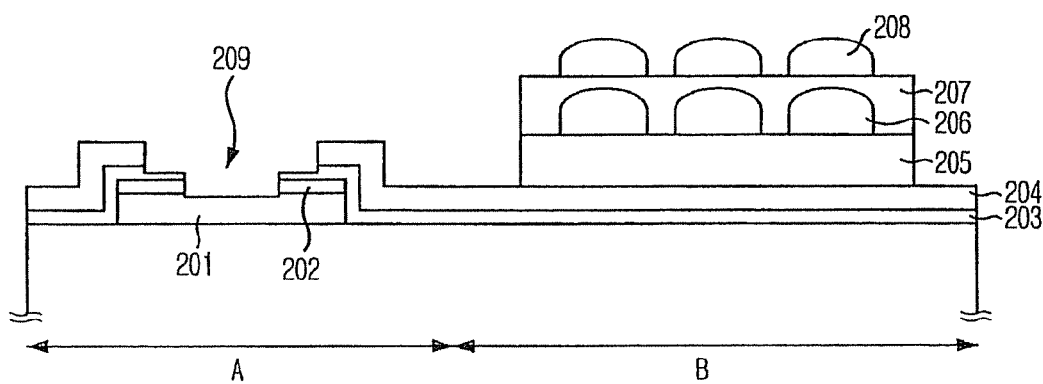
FIGS. 4A to 4H are cross-sectional views illustrating a method for manufacturing an image sensor in accordance with an embodiment of the present invention.

Referring to FIG. 4A, an aluminum (Al) metal interconnection 201, a nitride layer 202, an oxide layer 203, a nitride layer 204, a lower over coating layer (lower OCL) 205, color filters 206, an upper OCL 207, microlenses 208, and an opening 209 are formed over an underlying structure having various elements such as a photodiode and transistors constructing an image sensor.

Figure 4B:
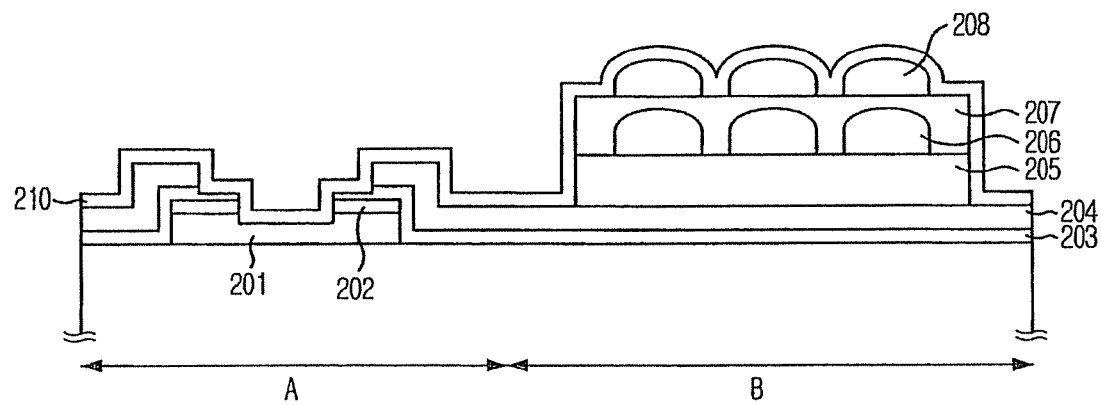

Referring to FIG. 4B, a titanium tungsten (TiW) layer 210 is formed as a lower adhesive layer along a surface profile of the resultant structure including the opening 209. The titanium tungsten layer 210 is formed to increase an adhesive force with the Al metal interconnection 201.

Figure 4C:
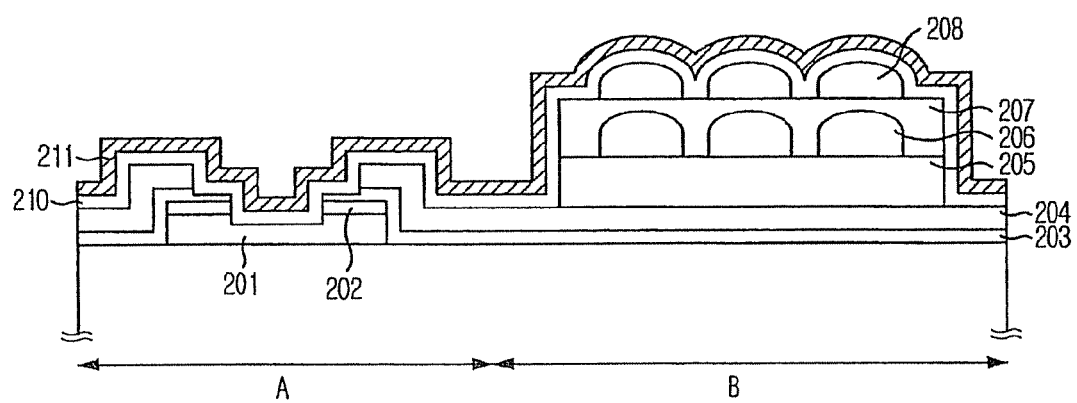
Figure 4D:
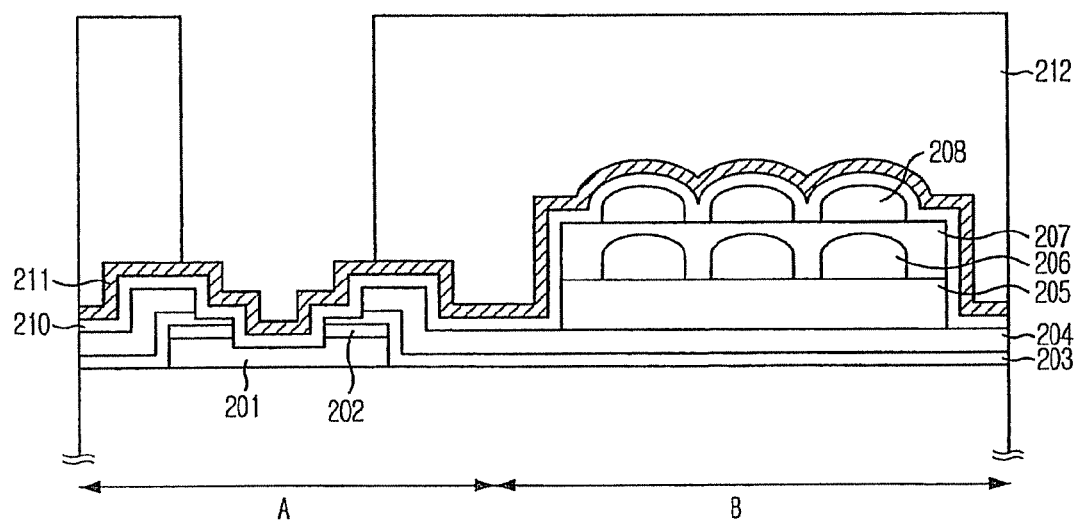

Referring to FIG. 4C, a gold (Au) layer 211 is formed as an upper adhesive layer on the titanium tungsten layer 210. Referring to FIG. 4D, a photoresist pattern 212 is formed over the resultant structure, wherein the photoresist pattern has an opening exposing a portion of the gold layer 211 where a bump will be formed.

Figure 4E:
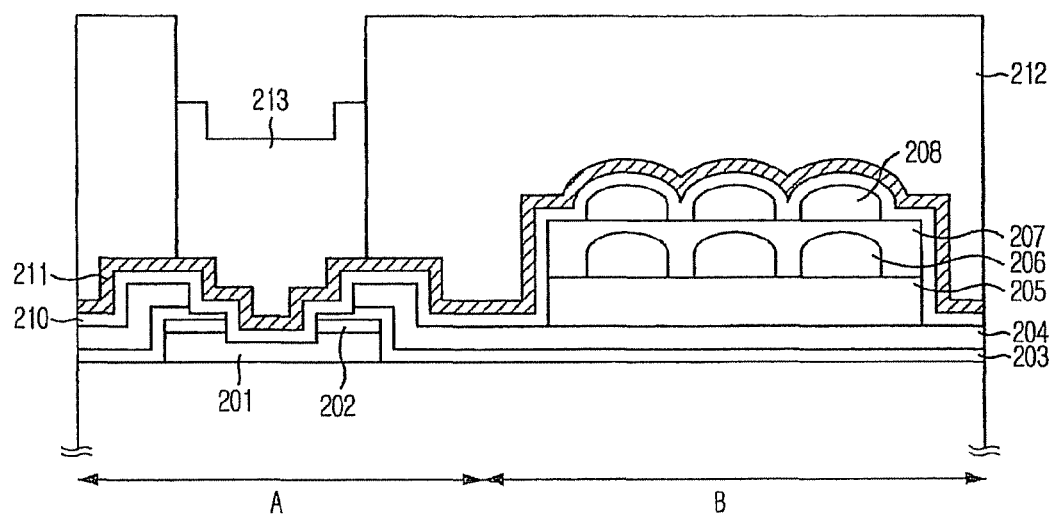
Figure 4F:
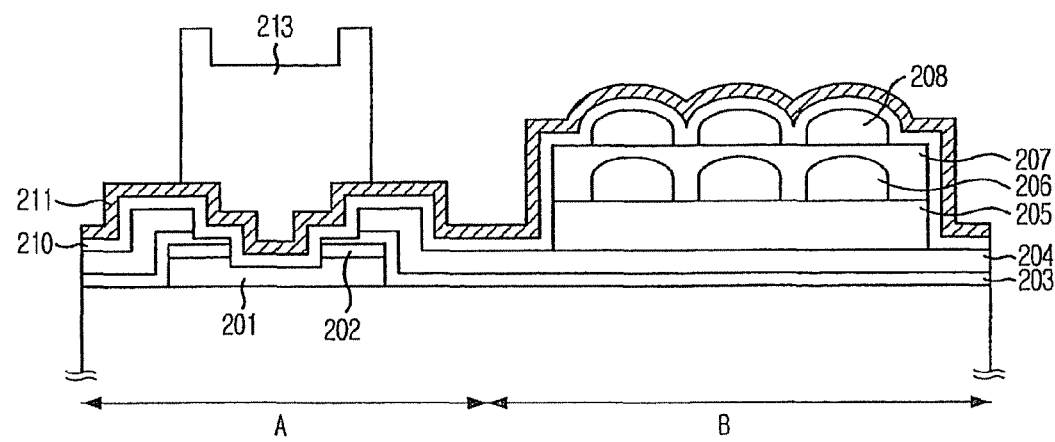

Referring to FIG. 4E, a bump 213 formed of Au is formed to fill the opening of the photoresist pattern 212. Here, the bump 213 of Au is formed using an electroplating process. Thus, the bump 213 is electrically connected to the Al metal interconnection 201. Referring to FIG. 4F, the photoresist pattern 212 is removed.

Figure 4G:
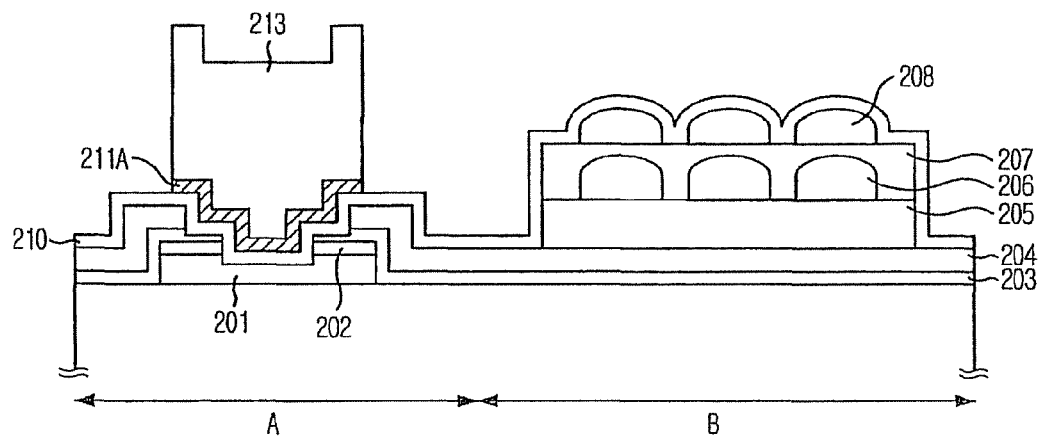

Referring to FIG. 4G, the gold layer 211, which is not covered with the bump 213, is selectively etched using an iodine-based solvent, e.g., $NH_4I$. Thus, a gold pattern 211A remains only under the bump 213.

Figure 4H:
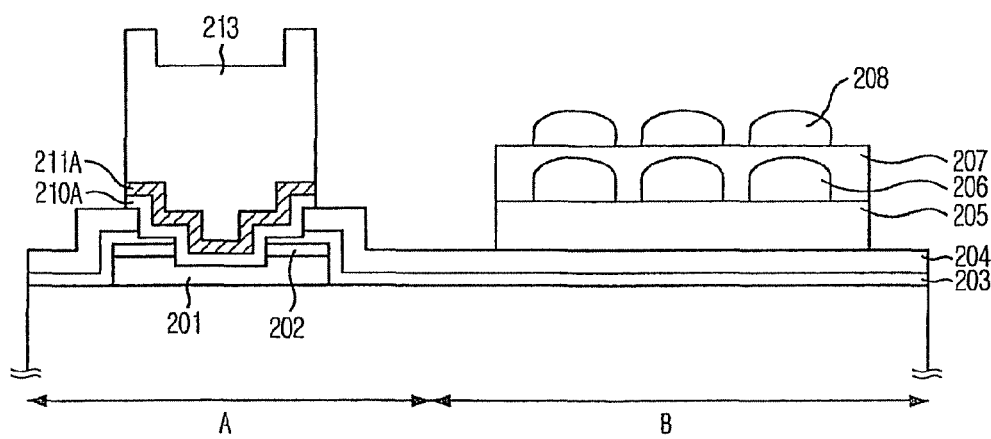

Referring to FIG. 4H, the titanium tungsten layer 210, which is not covered with the bump 213, is selectively etched using $H_2O_2$ solution. Thus, a TiW pattern 210A also remains only under the bump 213. However, the organic-based microlenses 208 may be exposed by the $H_2O_2$ solution, thereby being damaged. Alternatively, particles may be attached on the microlenses 208.

Figure 5:
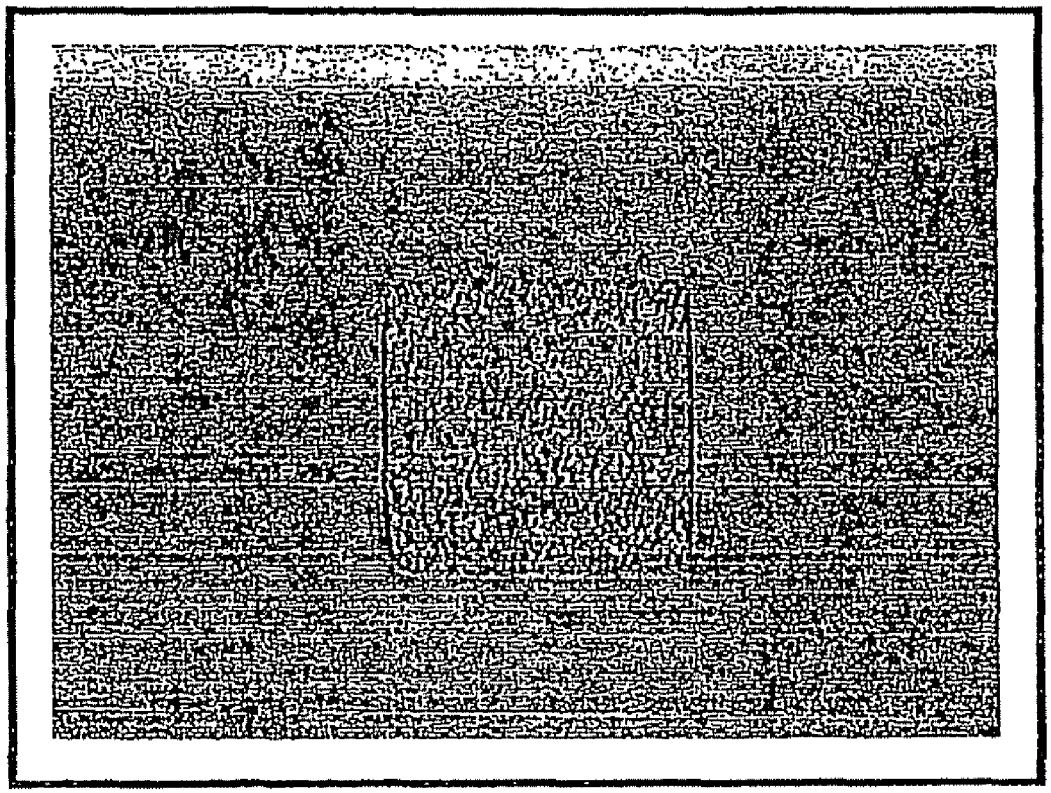
FIG. 5 illustrates a micrograph of a microlens after performing a bump process.
Figure 6A:
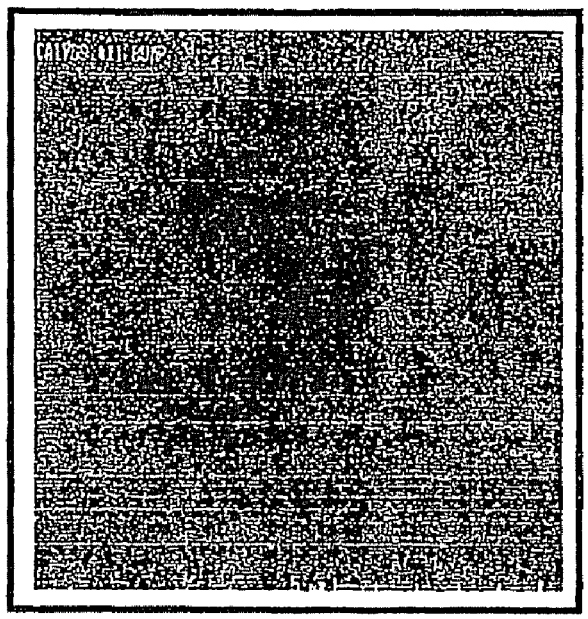
FIGS. 6A to 6D illustrate micrographs showing microlenses which are damaged and attached with particles.
Figure 6B:
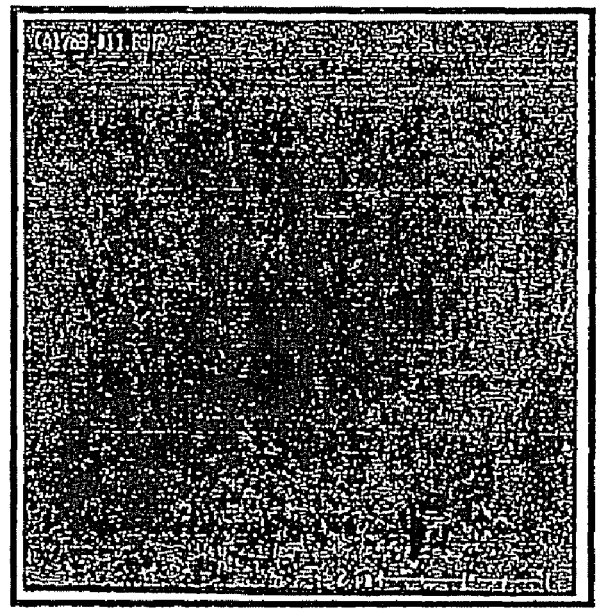
Figure 6C:
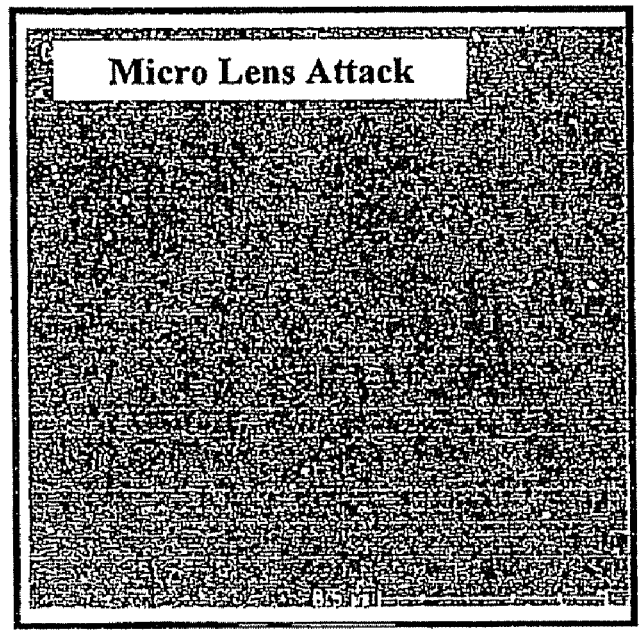
Figure 6D:
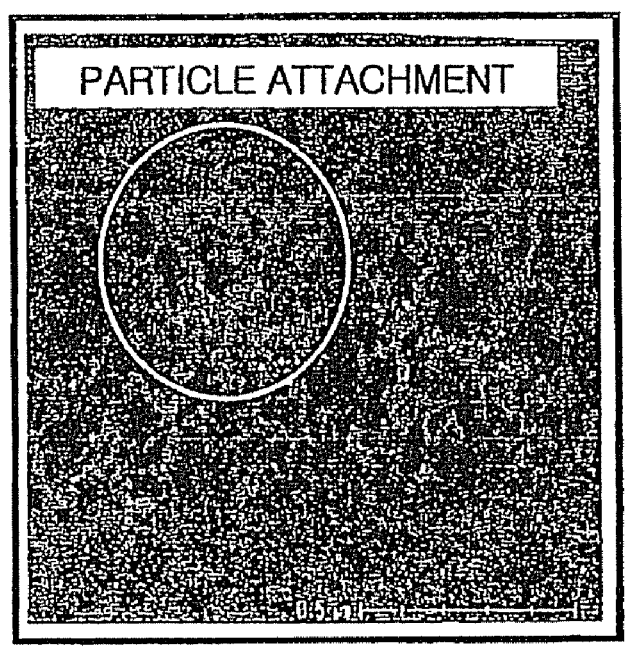

FIG. 5 and FIGS. 6A to 6D illustrate micrographs of an image sensor formed by the method for manufacturing the image sensor illustrated in FIGS. 4A to 4H. Specifically, FIG. 5 illustrates a region where the bump is formed, and FIGS. 6A to 6D illustrate a region where the microlenses are formed. As illustrated, the microlenses are damaged (see FIGS. 6A to 6C) or particles are attached on the microlenses (see FIG. 6D) after performing the process described in FIG. 4H.

As described above, when employing the method for manufacturing the image sensor without using the LTO layer, it is possible to prevent an increase of optical path from the microlens to the photodiode, and peeling and crack phenomena on the LTO layer. However, this fact often leads to a limitation in that the microlens may be damaged or the particles may be attached on the microlens during the bump process or wafer cutting process.

Therefore, in accordance with another embodiment of the present invention, the above limitation can be overcome by thinly depositing the LTO layer on the microlens to a thickness less than approximately 1,000 Å Those inorganic particles such as silicon attached on the LTO layer during the subsequent wafer cutting process can be easily desorbed using deionized water (DI) rinse. In the present embodiment, after the wafer cutting process, the thinly deposited LTO layer is selectively removed through a wet etching process using the bump as a hard mask with a solution containing fluoric acid-based vapor, e.g., hydrofluoric acid vapor. Accordingly, the microlenses are not damaged and the particles are not attached on the microlenses after the wafer cutting process, and further the image sensor without the LTO layer can be realized.

Specific embodiments of the present invention will be described below with reference to the accompanying drawings in more detail such that those skilled in the art will implement the technical idea of the present invention with ease. In the figures, the dimensions of layers and regions are exaggerated for clarity of illustration. It will also be understood that when a layer (or film) is referred to as being 'on' another layer or substrate; it can be directly on the other layer or substrate, or intervening layers may also be present. Further, like reference numerals refer to like elements throughout.

Structure

Figure 7:
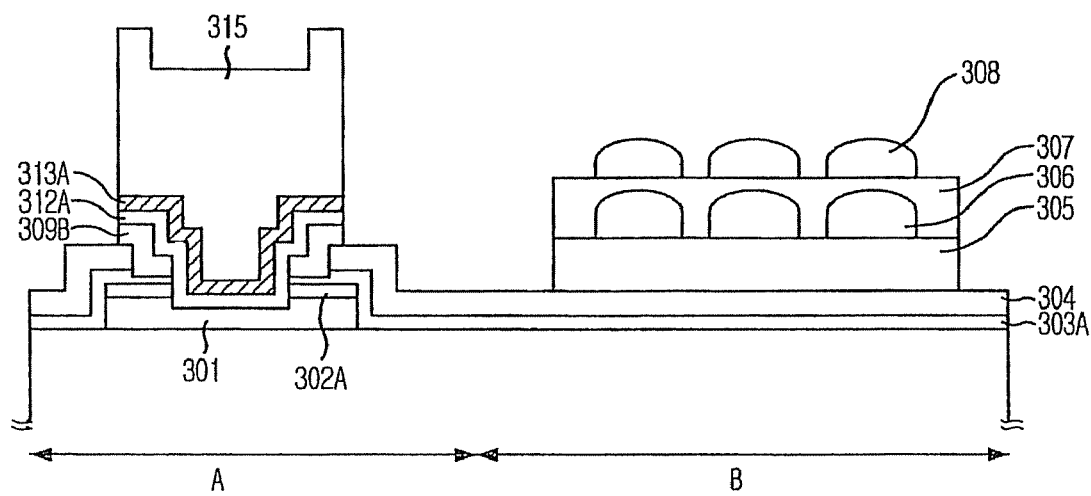
FIG. 7 illustrates an image sensor in accordance with an embodiment of the present invention.

FIG. 7 illustrates an image sensor in accordance with an embodiment of the present invention.

Referring to FIG. 7, an image sensor in accordance with an embodiment of the present invention includes a pad region A and a light-receiving region B. A metal interconnection 301, acting as a pad, and a bump 315, electrically connected to the metal interconnection 301, are formed in the pad region A. An LTO pattern 309B is disposed between the metal interconnection 301 and the bump 315, and will be used as a protective layer for protecting microlenses 308 against various factors causing damage to the microlenses 308 during a fabrication process. The thickness of the LTO pattern 309B should be less than approximately 1,000 Å In the image sensor in accordance with the embodiment of the present invention, a titanium tungsten pattern 312A acting as an adhesive layer may be further formed between the LTO pattern 309B and the bump 315 to increase an adhesive force between the metal interconnection 301 and the bump 315. A metal layer formed of the same material as the bump 315 may be further formed between the titanium tungsten pattern 312A and the bump 315. The metal layer serves as a seed layer.

An oxide pattern 303A and a patterned nitride layer 304, which act as a passivation layer, are formed in the light-receiving region B of the image sensor in accordance with the embodiment of the present invention. Thereafter, a lower OCL 305, color filters 306, an upper OCL 307, and microlenses 308 are formed over the resultant structure in sequence.

In the image sensor in accordance with the embodiment of the present invention, since the LTO pattern 309B does not exist over the microlenses 308, the microlenses 308 are not damaged by the peeling and crack phenomenon occurring due to the LTO layer. Further, it is also possible to prevent the increase of transmission distance of light, which is incident on the photodiode of the light-receiving region B through the microlenses 308, because the LTO layer does not exist over the microlenses 308. Although it will be described later, the wafer cutting process is performed under the existence of the LTO layer for protecting the microlenses 308 against the particles generated during the wafer cutting process, and thereafter the LTO layer of the light-receiving region B is removed using the bump 315 as an etch barrier layer.

Manufacturing Method

FIGS. 8A to 8J are cross-sectional views illustrating a method for manufacturing an image sensor in accordance with an embodiment of the present invention. Herein, the region A denotes a region where a pad will be formed (hereinafter, referred to as the pad region A), and the region B denotes a region where a light-receiving region where a light-receiving element of a unit pixel will be formed (hereinafter, referred to as the light-receiving region B).

Figure 8A:
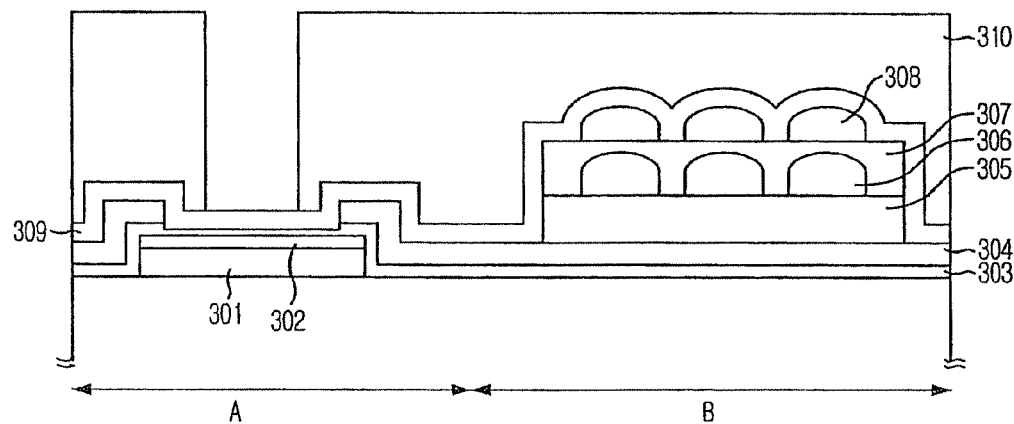
FIGS. 8A to 8J are cross-sectional views illustrating a method for manufacturing an image sensor in accordance with an embodiment of the present invention.

Referring to FIG. 8A, an Al metal interconnection 301, a nitride layer 302, a patterned oxide layer 303, a patterned nitride layer 304, a lower OCL 305, a plurality of color filters 306, an upper OCL 307, and a plurality of microlenses 308 are formed over an underlying structure having various elements such as a photodiode and a transistor constructing an image sensor. Here, the nitride layer 302 is an optional element, which can be omitted depending on circumstances. The patterned oxide layer 303 and the patterned nitride layer 304 acting as a passivation layer may be formed as a mono-layered structure instead of a multi-stacked structure.

The nitride layer 302 serves as an etch stop layer during the etching process for forming a pad, and is formed of TiN, $Si_3N_4$ or SiON. The patterned oxide layer 304 and the patterned nitride layer 305 serve as a protective layer for protecting the metal interconnection 301. The patterned nitride layer 305 is a final passivation, and is formed of $Si_3N_4$ or SiON. The patterned oxide layer 304 is formed of a tetraethyl orthosilicate (TEOS) using a plasma enhanced chemical vapor deposition (PECVD) process. However, the patterned oxide layer 304 is not limited to TEOS. Rather, those oxide-based materials having an etch selectivity to the nitride layer 304 may be used as the patterned oxide layer 304.

An LTO layer 309 is formed along a surface profile of the resultant structure including the microlenses 308 such that it has a thickness less than approximately 1,000 Å e.g., in the range of approximately 10 Å to approximately 1,000 Å Herein, if the LTO layer 309 becomes thicker in spite of its desirable thickness less than approximately 1,000 Å the LTO layer 309 is more susceptible to stress due to a subsequent process, e.g., an ashing process for removing a photoresist pattern, which makes peeling and crack phenomenon more serious. From the experimental result, the peeling and crack phenomenon became more serious when the LTO layer 309 was formed to a thickness greater than approximately 1,000 Å Therefore, the thickness of the LTO layer 309 should be controlled to be less than approximately 1,000 Å Afterward, a photoresist pattern 310 is formed, wherein the photoresist pattern 310 has an opening exposing a portion of the LTO layer 309 where a pad will be formed.

Figure 8B:
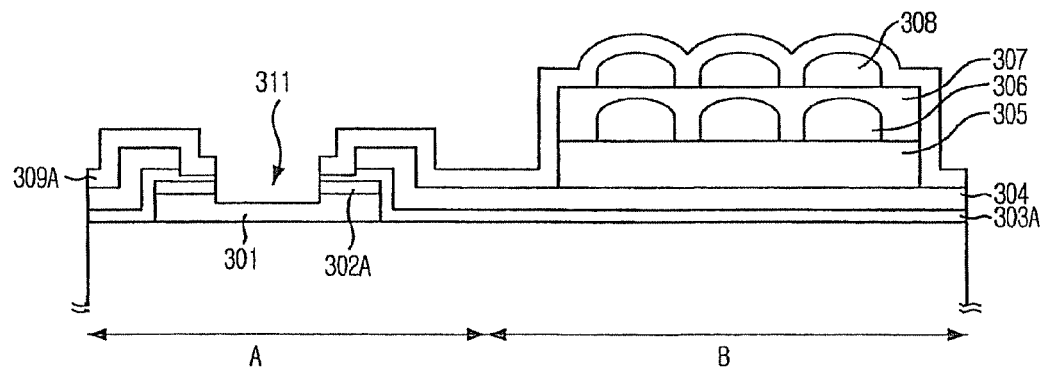

Referring to FIG. 8B, the exposed portion of the LTO layer 309, the patterned oxide layer 303 and the nitride layer 302 are wet-etched using the photoresist pattern 310 as an etch mask, thereby forming an opening 311 exposing a portion of the metal interconnection 301. As a result, an LTO pattern 309A, an oxide pattern 303A, and a nitride pattern 302A are formed. Here, the portion exposed through the opening 311 becomes a pad. Subsequently, the photoresist pattern 310 is removed using a removal process or an ashing process.

Figure 8C:
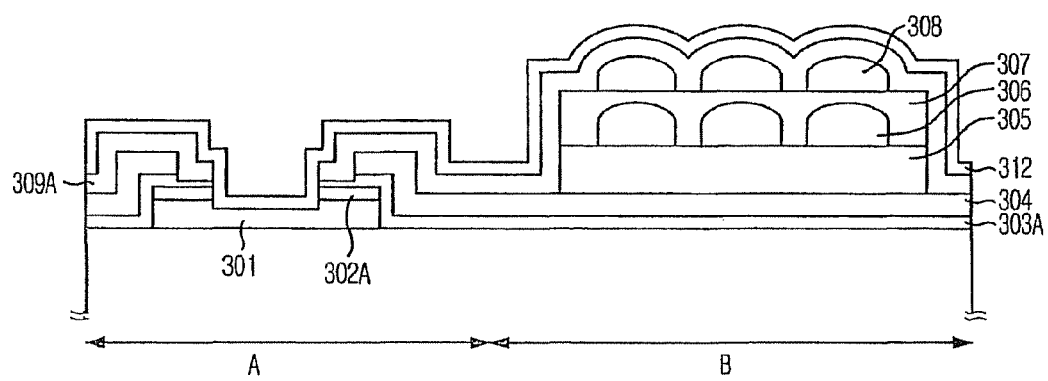

Referring to FIG. 8C, a titanium tungsten layer 312 acting as a lower adhesive layer may be formed along a surface profile of the resultant structure including the opening 311. The titanium tungsten layer 312 is deposited by a sputtering method. Here, the lower adhesive layer is not limited to titanium tungsten, but it may be varied with a material of the metal interconnection and a material of a bump that will be formed later. For instance, the lower adhesive layer may be formed of transition metal, rare earth metal, and an alloy of the transition metal and the rare earth metal. Alternatively, the lower adhesive layer may include a transition metal nitride layer, a rare earth metal layer or multiple layers having a combination of the transition metal nitride layer and the rare earth metal nitride layer.

Figure 8D:
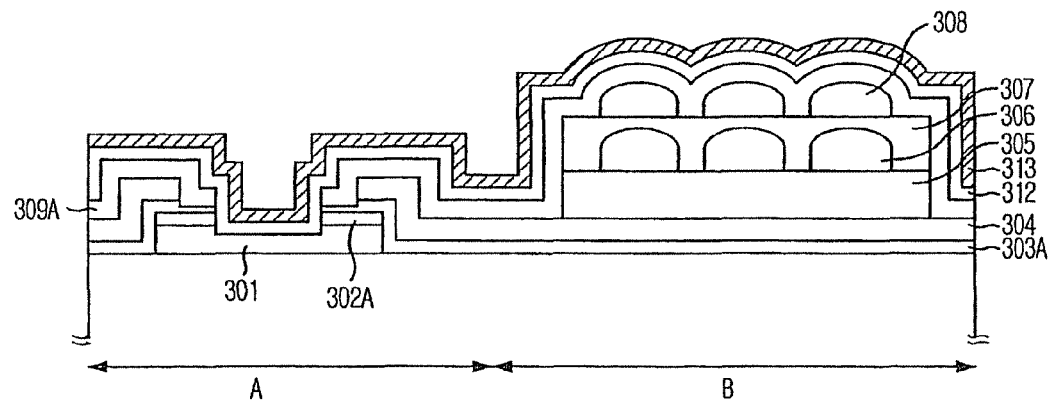

Referring to FIG. 8D, a gold layer 313 is formed on the titanium tungsten layer 312 as a seed layer or an adhesive layer. Like the titanium tungsten layer 312, the gold layer 313 is also deposited using a sputtering method. Thus, the processes of forming the gold layer 313 and the titanium tungsten layer 312 can be performed in-situ using the same sputtering chamber. The seed layer is not limited to gold, but it may be varied with a material of the bump that will be formed later. Because the bump is formed of gold, the seed layer is also formed of the same material as the bump, i.e., gold, to maximize the adhesive force with the underlying layer.

Figure 8E:
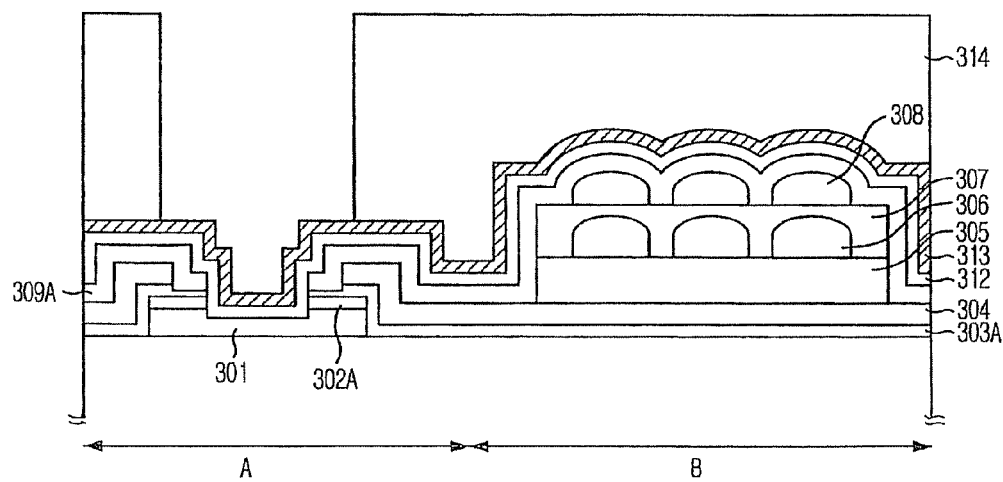

Referring to FIG. 8E, a photoresist pattern 314 is formed on the resultant structure, wherein the photoresist pattern 314 has an opening exposing a portion of the gold layer 313 where a bump will be formed.

Figure 8F:
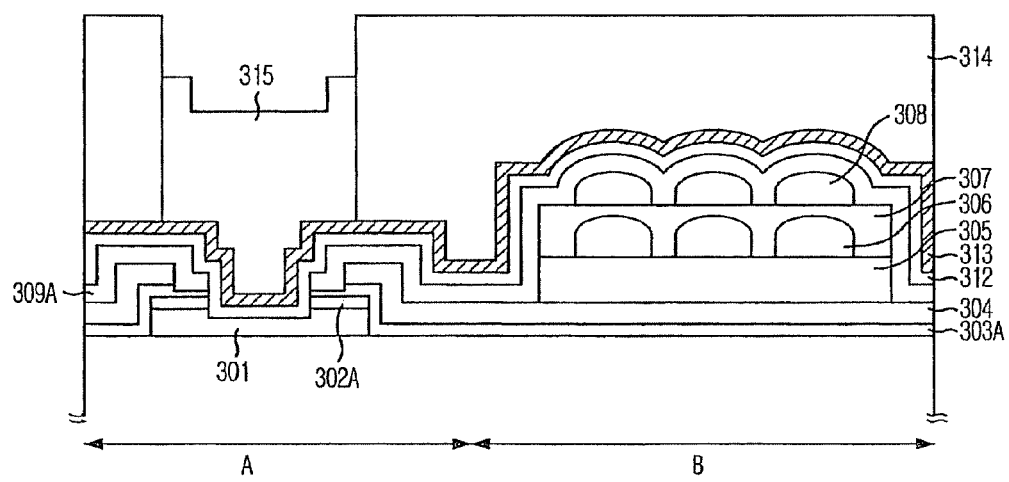
Figure 8G:
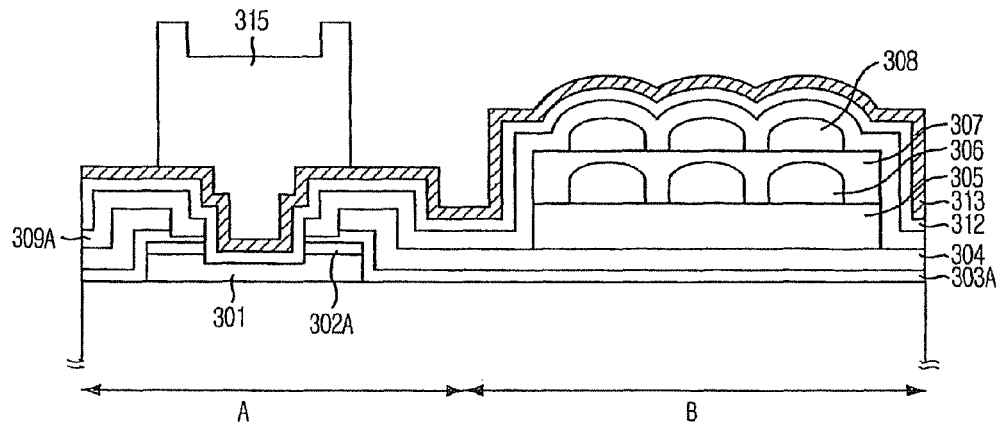

Referring to FIG. 8F, a bump 315 formed of gold is formed to fill the opening of the photoresist pattern 314. Here, the bump 315 is formed using an electroplating process. Thus, the bump 315 is electrically connected to the metal interconnection 301. The material for the bump 315 is not limited to gold, but other materials used as the bump may be employed as the bump 315. Referring to FIG. 8G, the photoresist pattern 314 is removed.

Figure 8H:
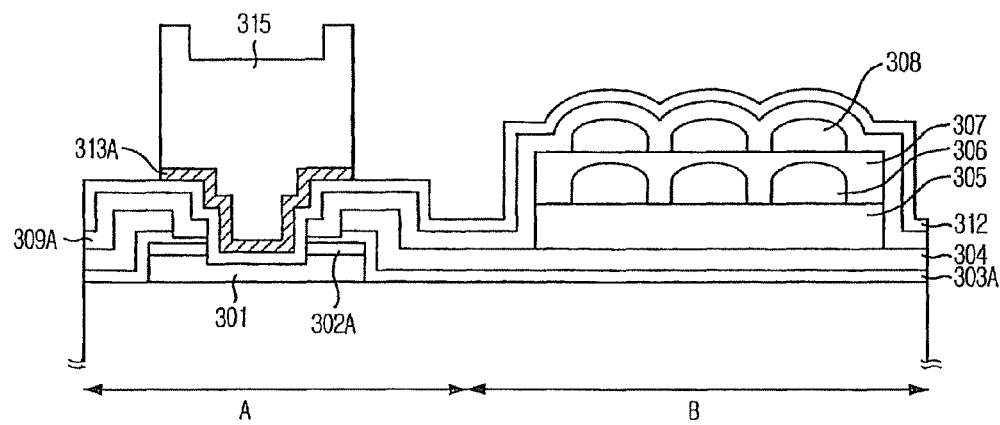

Referring to FIG. 8H, the gold layer 313 in the light receiving region B, which is not covered with the bump 213, is wet-etched by an iodine-based solvent, e.g., $NH_4I$, using the titanium tungsten layer 312 as an etch barrier layer. During this process, the bump 315 may also be etched partially. Thus, a gold pattern 313A remains only under the bump 315.

Figure 8I:
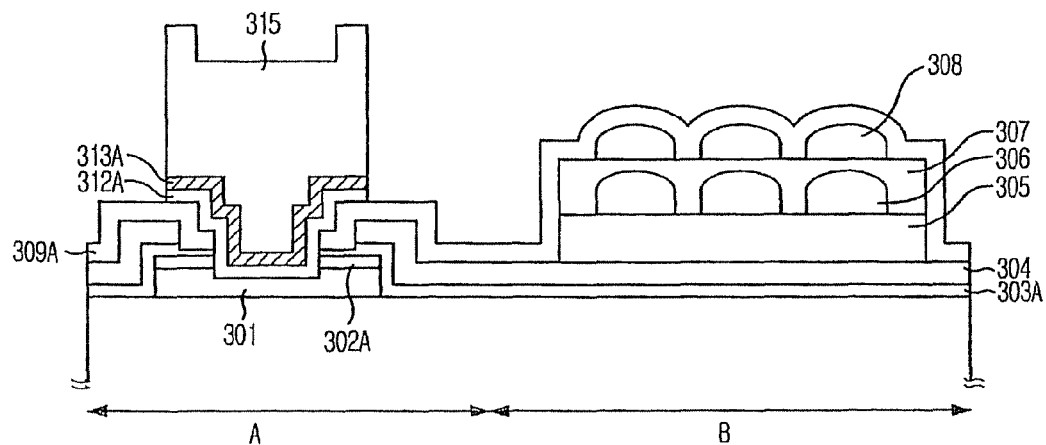

Referring to FIG. 8I, the titanium tungsten layer 312, which is not covered with the bump 315, is selectively etched using $H_2O_2$ solution. Thus, a titanium tungsten pattern 312A remains only under the bump 315. As the LTO pattern 309A is formed of an inorganic material, the LTO pattern 309A is not damaged even during the etching of the titanium tungsten layer 312 using the $H_2O_2$ solution. Accordingly, the microlenses 308 formed under the LTO pattern 309A is also protected by the LTO pattern 309A, and thus the microlenses 308 are not damaged.

A cleaning process may be performed on the resultant structure so that contaminants such as particles attached on the LTO pattern 309A may be removed. This cleaning process may be performed using a D-sonic or rinsing process. For reference, the D-sonic process is a kind of cleaning process for removing the particles with a strong adhesive force with the application of sonic wave on pure water. Thus, the particles can be removed by high vibration on the surface of a target layer.

Although not shown, a wafer cutting process is performed for cutting the wafer into each die. At this time, particles such as silicon produced during the wafer cutting process may remain on the LTO pattern 309A, and the particles can be easily removed using the D-sonic and rinsing process.

Figure 8J:
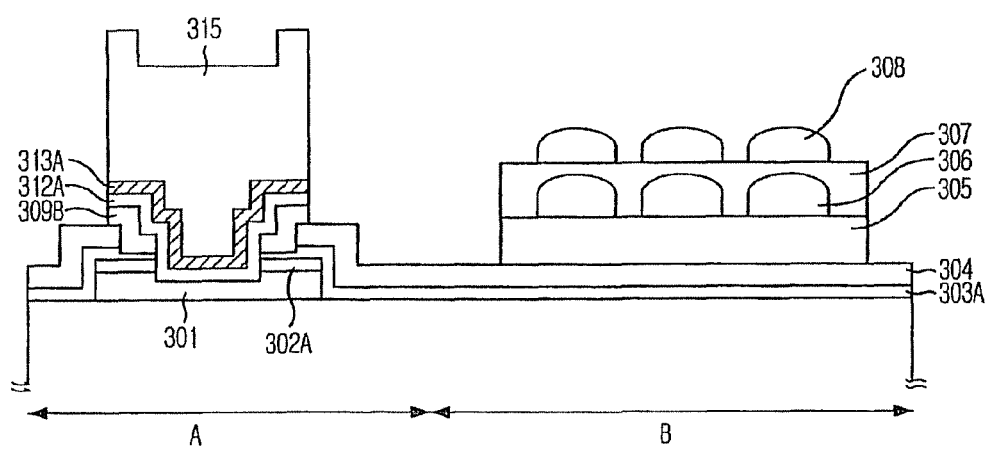

Referring to FIG. 8J, an etching process is performed using the bump 315 as a hard mask to selectively remove the exposed LTO pattern 309A. At this time, the etching process is performed such that a primary process is performed to etch the LTO pattern 309A formed in the light-receiving region B using an etching solution containing fluoric acid-based vapor, e.g., etching solution containing HF and $NH_4F$ or buffered oxide etchant (BOE)-based etching solution, and a secondary process is performed to rinse the LTO pattern 309A with deionized water. This etching process may be performed at a room temperature, and may proceed using a spin, bath or spray technique. Thus, it is possible to selectively etch only the LTO pattern 309A in the light-receiving region B without damaging the microlens 308 formed of an organic material. As a result, the LTO pattern 309B remains only under the bump 315. Afterward, the resultant structure is dried using $N_2$ gas.

As described above, in accordance with the present invention, the present invention provides several advantageous merits below.

First, since the LTO layer does not exist in the image sensor, it is possible to reduce a distance of light reaching a photodiode from a microlens shorter as compared with the case in which the LTO layer exist in the image sensor.

Second, the LTO layer is formed relatively thinly, more specifically, the LTO layer is formed to a thickness less than approximately 1,000 Å and thus it is possible to minimize an occurrence of peeling and crack phenomena during the removal of the photoresist pattern.

Third, because the wafer cutting process is performed in a state that the LTO layer is formed over the microlenses, it is possible to prevent the microlenses from being damaged during the wafer cutting process. In addition, it is possible to prevent attachment of the particles such as silicon on the microlenses.

While the present invention has been described with respect to the specific embodiments, it will be apparent to those skilled in the art that various changes and modifications may be made without departing from the spirit and scope of the invention as defined in the following claims. For instance, the method according to the exemplified embodiments of the present invention can be implemented to manufacture various types of image sensors such as complementary metal-oxide semiconductor (CMOS) image sensors.

What is claimed is:

1. An image sensor comprising:
a pad disposed at a first region of a substrate;
a passivation layer disposed over the first region and over a second region of the substrate, wherein the passivation layer includes an opening exposing a portion of the pad in the first region;
a color filter disposed over the passivation layer in the second region;
a microlens disposed over the color filter;
a conductive bump disposed over the exposed portion of the pad; and
a conductive layer disposed between the conductive bump and the exposed portion of the pad, wherein the conductive layer is formed from a material having material properties making it removable by an etching process, and wherein the conductive bump is formed from a conductive material having material properties rendering it substantially resistant to the etching process.

2. The image sensor of claim 1, further comprising a protective layer underlying a portion of the conductive bump and further overlying a portion of the pad, wherein the protective layer includes a low thermal oxide (LTO)-based material.

3. The image sensor of claim 1, wherein the passivation layer further comprises a multi-stacked structure including an oxide-based layer and a nitride-based layer.

4. The image sensor of claim 1, wherein the conductive layer is formed from an adhesive material, and wherein the image sensor further comprises an adhesive layer overlying the conductive layer beneath the conductive bump.

5. The image sensor of claim 4, wherein the adhesive layer comprises a metal selected from a group of metals consisting of a transition metal, a rare earth metal, and an alloy of a transition metal and a rare earth metal.

6. The image sensor of claim 1, wherein the pad comprises aluminum (Al).

7. The image sensor of claim 1, wherein the conductive bump comprises gold (Au).

8. A pixel of an image sensor, the pixel comprising:
a light-receiving region disposed over a substrate;
an interconnect region disposed over the substrate, wherein the interconnect region includes a conductive pad;
a low-temperature oxide layer having a first portion at which the conductive pad is exposed and a second portion at which a peripheral portion of the conductive pad is covered; and
a conductive bump disposed over the conductive pad and extending through the first portion of the low-temperature oxide layer, wherein the low-temperature oxide layer is removable by an etching process, and wherein the conductive bump is formed from a conductive material that is not removable by the etching process.

9. The pixel of claim 8, further comprising a conductive layer disposed between the conductive bump and the conductive pad, wherein the conductive layer includes a conductive material that is removable by the etching process.

10. The pixel of claim 8, further comprising an adhesive layer disposed between the conductive bump and the conductive pad.

11. The pixel of claim 10, wherein the adhesive layer comprises a metal selected from a group of metals consisting of a transition metal, a rare earth metal, and an alloy of a transition metal and rare earth metal.

12. The pixel of claim 10, wherein the adhesive layer comprises a transition metal nitride layer, a rare earth metal nitride layer, or multiple layers including a combination of a transition metal nitride layer and a rare earth metal nitride layer.

13. The pixel of claim 10, further comprising a seed layer disposed over the adhesive layer.

14. The pixel of claim 8, wherein the pad comprises aluminum (Al) and the conductive bump comprises gold (Au).

15. A pixel of an image sensor, the pixel comprising:
a first region of a substrate, wherein the first region includes:
a metal interconnect line comprising a conductive pad;
a protective layer having an opening over the conductive pad; and
a conductive bump extending through the opening of the protective layer, wherein the protective layer is formed from a material that is removable by an etching process, and wherein the conductive bump is formed from a conductive material that is not removable by the etching process; and
a second region of the substrate, wherein the second region includes:
a color filter;
a microlens disposed over the color filter; and
wherein the protective layer comprises an open area configured to allow light to pass therethrough and reach the microlens.

16. The pixel of claim 15, wherein the protective layer comprises a low-temperature oxide.

17. The pixel of claim 15, further comprising a conductive layer disposed between the conductive bump and the conductive pad, wherein the conductive layer comprises a material that is removable by the etching process.

18. The pixel of claim 15, further comprising an adhesive layer disposed between the conductive bump and the conductive pad.

19. The pixel of claim 18, further comprising a seed layer disposed over the adhesive layer.

20. The pixel of claim 18, wherein the adhesive layer comprises a material that is removable by the etching process.

* * * * *